United States Patent
Wang et al.

(10) Patent No.: US 7,371,098 B2
(45) Date of Patent: May 13, 2008

(54) LAND GRID ARRAY CONNECTOR WITH REINFORCEMENT STIFFENER

(75) Inventors: Qing-Feng Wang, ShenZhen (CN); Fu-Jin Peng, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/708,720

(22) Filed: Feb. 20, 2007

(65) Prior Publication Data
US 2007/0197077 A1 Aug. 23, 2007

(30) Foreign Application Priority Data
Feb. 21, 2006 (CN) .......................... 200620069562

(51) Int. Cl.
*H01R 13/62* (2006.01)

(52) U.S. Cl. .......................... 439/330; 439/71; 439/331

(58) Field of Classification Search ........ 439/330–331, 439/71
See application file for complete search history.

(56) References Cited

U.S. PATENT DOCUMENTS 4,887,969 A * 12/1989 Abe ............................ 439/73

* cited by examiner

*Primary Examiner*—Javaid H. Nasri
(74) *Attorney, Agent, or Firm*—Wei Te Chung

(57) ABSTRACT

An electrical connector comprises an insulative housing (2), a plurality contacts (4) received therein, at least a pair of securing members (3) disposed on adjacent corners of housing (2). The securing members (3) are used for supporting a chip module and able to slide in an upright direction, which can solve the balance problem produced in process of mounting a heat sink.

17 Claims, 4 Drawing Sheets

LAND GRID ARRAY CONNECTOR WITH REINFORCEMENT STIFFENER

BACKGROUND OF THE INVENTION

1. Field of the Invention

This patent application claims priority to China Application No. CN 200620069562.2, filed on Feb. 21, 2006, which is hereby incorporated by reference herein its entirety.

The present invention relates to an electrical connector, and more particularly to an electrical connector for securing connecting an electronic package such as a chip module and a circuit substrate such as a printed circuit board (PCB).

2. Description of the Prior Art

Land grid array (LGA) electrical connectors are widely used in the connector industry for electrically connecting LGA chips to printed circuit boards (PCBs) in personal computers (PCs). Conventionally, one kind of the LGA connector mainly comprises an insulative housing, a multiplicity of contacts received therein, a metallic stiffener partly covering and reinforcing the housing, and a metal clip and a cam lever pivotably mounting on two opposite sides of the stiffener. The housing defines a multiplicity of terminal passageways in a rectangular array, for interferentially receiving corresponding contacts. In assembly, the housing firstly engages interferentially with stiffener. Then the clip and the lever are mounted on two sides of the stiffener. Successively, the assembled the housing with stiffener is further attached on a printed circuit board by a locking member. At last, the contacts received in the housing are soldered to the printed circuit board. Secondly, engaging the chip module with the electrical connector, the clip is rotated upward. The chip module is placed in the central cavity of the housing. The clip is rotated from a vertical portion to a horizontal portion to make the two opposite sides of the clip attach on corresponding sides of the chip module. The cam lever is rotated to drive the clip to gradually approach the housing until the pressing portions of the clip press the chip module downwardly to make the contact pads of the chip module contact with the contact portions of the contacts and make the chip module received in the central cavity therein. As a result, mechanical and electrical engagement between the chip module and the PCB via the electrical connector is attained.

However, there lies in some drawbacks that the locking structure used for securing the chip module is too complicate for produce, hence increasing the cost. In addition, when the lever is oriented to a horizontal level for pressing the clip downwardly, an anti-force will be produced, which can destroy the solder quality of the electrical connector with the printed circuit board. At last, when a heat sink is mounted on the housing, for two lateral sides of the heat sink are not mounted at the same time, so when one side of the heat sink is firstly pressed downwardly and locked, the chip module produces incline. When the other side of the heat sink is pressed downwardly and locked, the inclined chip module is difficult to pressed downwardly, which destroys the connection between the terminal and the contacting pads of the chip module.

Thus, there is a need to provide a new electrical connector that overcomes the above-mentioned problems.

SUMMARY OF THE INVENTION

Accordingly, an object of the present invention is to provide an electrical connector able to reliably secure a chip module on a printed circuit board.

To fulfill the above-mentioned object, an electrical connector in accordance with a preferred embodiment of the present invention comprises an insulative housing, a plurality contacts received therein, at least one securing members disposed on corners of housing.

Relative to the conventional electrical connector, the electrical connector in the invention defines at least one securing member, which makes the structure of the electrical connector more simplified and there is no anti-force produced to destroyed the solder quality of electrical connector and the printed circuit board. So the electrical connector can meet the need of the higher stability and accuracy.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
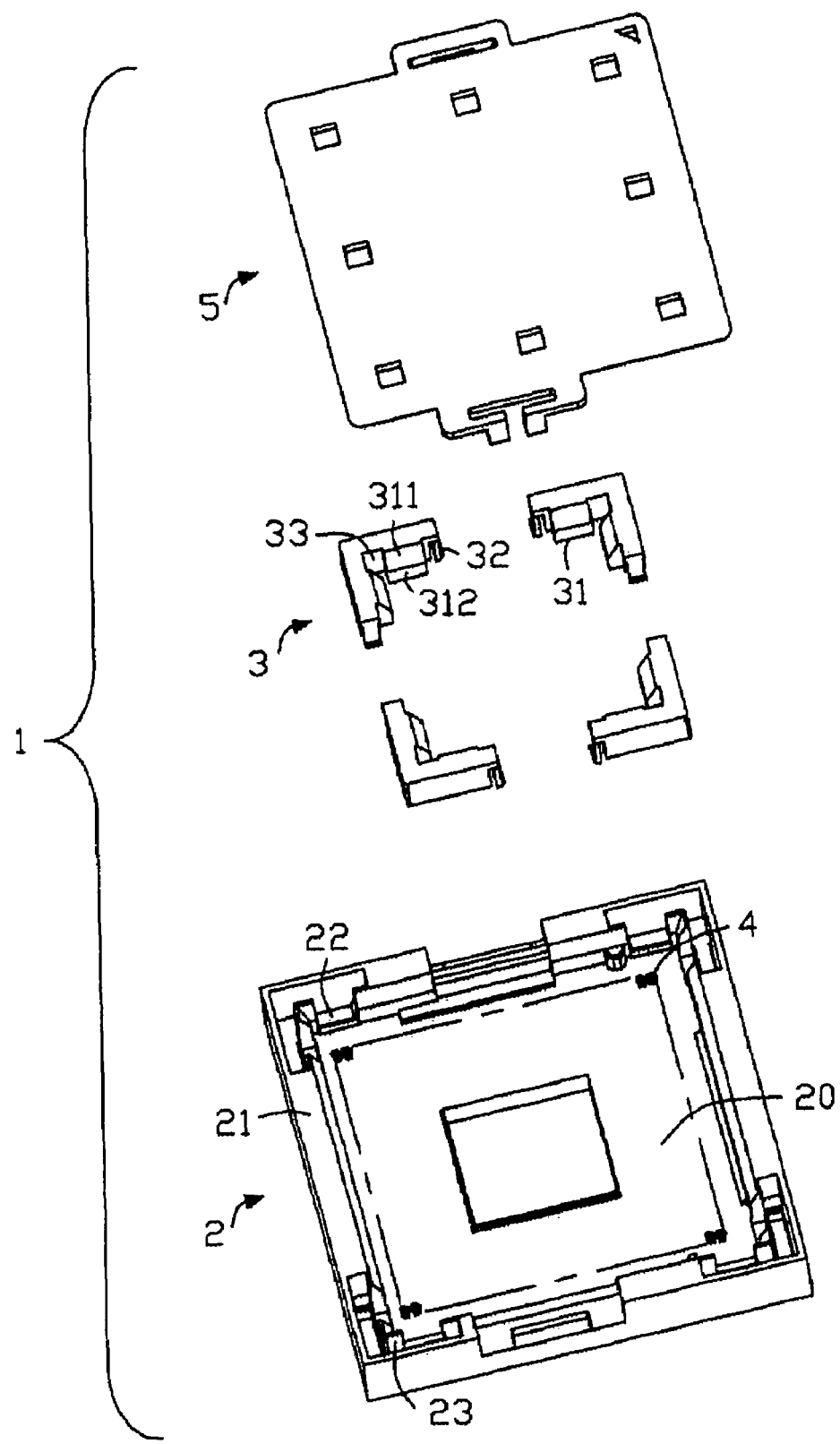
FIG. 1 is an exploded, isometric view of an electrical connector in accordance with a preferred embodiment of the present invention.
Figure 2:
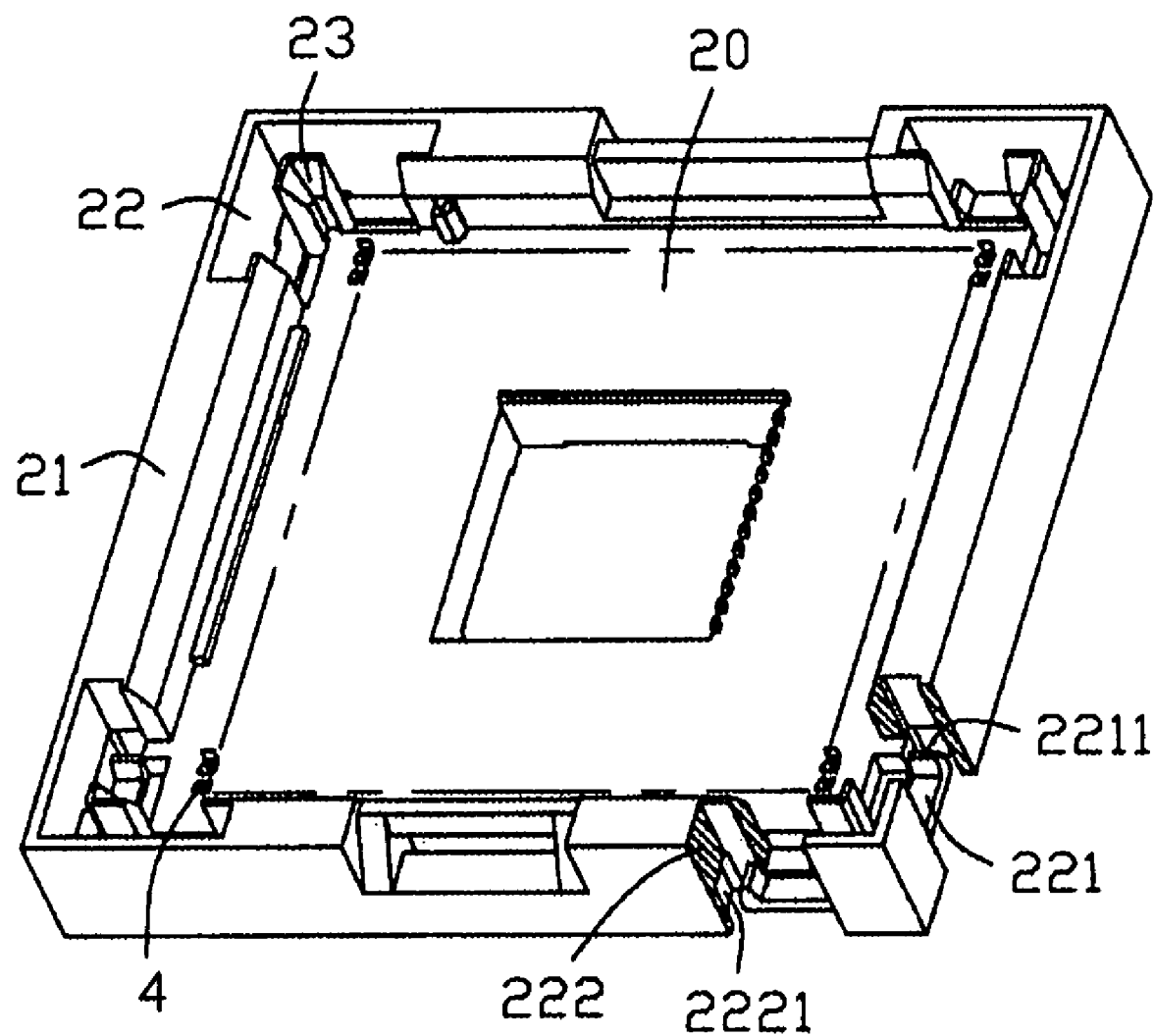
FIG. 2 is a cross-sectional view of the housing shown in FIG. 1.

Referring to FIGS. 1-2, the electrical connector 1 in accordance with the embodiment of the invention comprises a generally rectangular insulative housing 2, a multiplicity of contacts 4 received in the housing 2, a pick up cap covering on the housing 5, the insulative housing 2 defines a securing member 3 on each corner thereof for abutting against the chip module. The securing member 3 can slide on the housing 2 in an upright direction.

The housing 2 defines a generally rectangular base portion 20 in a middle thereof and four sidewalls 21 extending from sides of the base portion 20. The base portion 20 is used for receiving the chip module therein. A multiplicity of passageways are defined in a portion of the housing 2 under the base portion 20, the passageways receiving a corresponding number of the contacts 4 therein respectively. The base portion 20 defines a locating pole 23 on each corner thereof received in the engaging concave 33 for engaging with the securing member 3. The housing 2 defines a recess 22 formed on each corner between the sidewalls 21 for engaging with the securing member 3. The recess 22 defines a pair of cantilevers 221 vertically to each other on sidewalls adjacent to each corner and each cantilever 221 defines an elastic means 2211. In addition, sidewalls of the recess 22 far away each corner define a channel 2221 for engaging with the anchoring hook 32 of the securing member 3.

The securing member 3 is configured as two rectangular supporting members vertical to each other and defines a pair of symmetric interfering ribs 31 in center positions of the supporting member. The interfering member 31 comprises an indented lead portion 311 and a projected securing portion 312. The two interfering ribs 31 of the same securing member 3 cooperatively form an engaging concave 33. Furthermore, the securing member 3 defines a pair of elastic L-shaped hooks 32.

Figure 3:
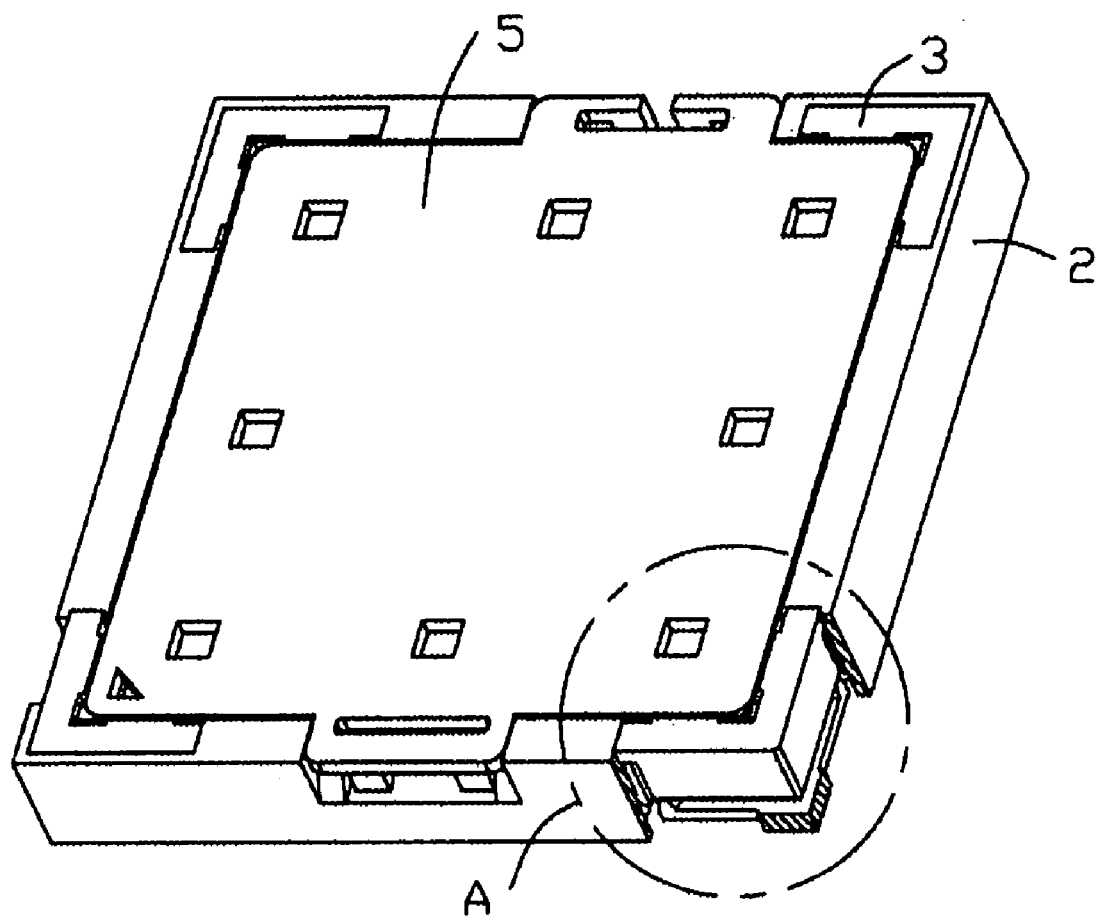
FIG. 3 is a cross-sectional view of a circle A of the electrical connector described in FIG. 1.
Figure 4:
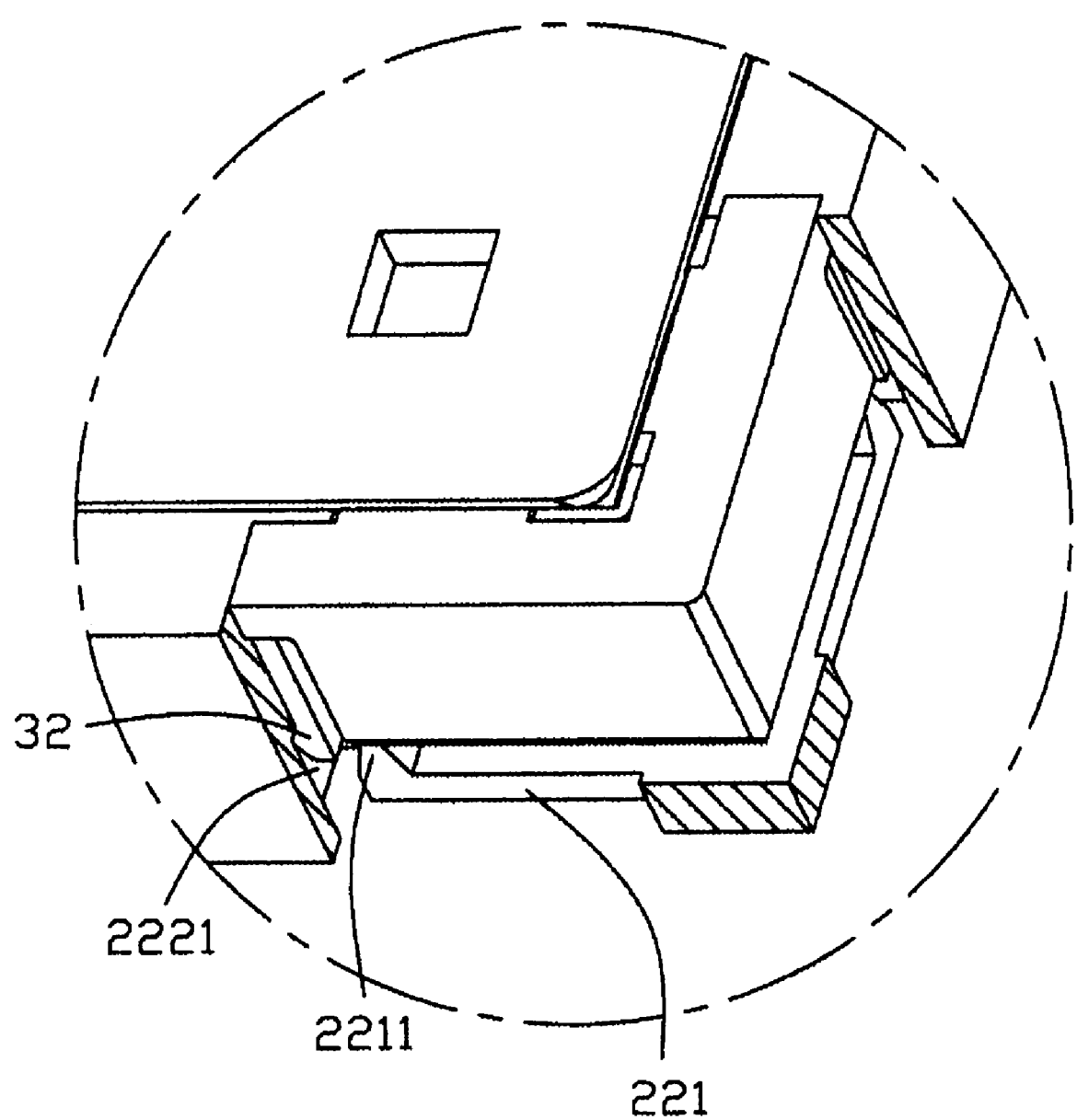
FIG. 4 is a amplified view of the circle A described in FIG. 3.

Referring to FIGS. 3-4, in assembly, the contacts 4 are inserted into the passageways of housing 2 and the securing member 3 engages with the recess 22 of the housing 2. At this moment, the securing portions 312 of the interfering ribs 31 are disposed slightly lower than the inner surface of the sidewalls 21. Each elastic means 2211 of the cantilever 221 abuts against a bottom surface of the securing member 3. That is to say the elastic cantilever 221 supports the securing member 3. The hooks 32 of the free end of the securing member 3 abut against the channels 2221 of the sidewalls 222 of the recess 22. In addition, the sidewalls 21 and the locating pole 23 engage interferentially with the securing member 3. In this situation, the securing member 3 can slide in an upright direction. In assembly, the housing 2 is firstly mounted on the printed circuit board. Then the contacts 4 received in the housing 2 are soldered to the printed circuit board. Successively the chip module is attached above the housing 2 and slightly abutting against the leading portion 311 of the interfering ribs 31. When a heat sink is mounted above the chip module, and one side of the heat sink is pressed downwardly and locked. The balance of chip module will be destroyed, hence first opposite sides of the chip module can be pressed downwardly and locked by the securing portion 312 of the securing member via the leading function of the leading portion 311. After the first pair of opposite sides of the chip module being secured, the other sides of the chip module abut against the leading portions 311 of the corresponding referring ribs 31 at this moment, the chip module is inclined relative to the horizontal plane. When 1 the other sides of the heat sink are locked, the spring cantilever 221 received in recess 22 can produce an elastic deformation, which makes the securing member 3 slide downwardly and eases the incline situation of the chip module. So the connection effect between contacting pads of the chip module and the contacts can be improved.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for electrically connecting an electronic package and a printed circuit board (PCB), comprising:
   an insulative housing having a base portion and sidewalls extending from peripheral of the base portion and defining a substantially rectangular cavity in a middle thereof, the cavity being adapted for receiving the electronic package therein;
   a plurality of electrical contacts received in the housing;
   at least one securing member engaged in the sidewalls of the housing for supporting the chip module and able to slide in a upright direction.

2. An electrical connector assembly comprising:
   an insulative housing defining a substantially rectangular cavity in a middle thereof;
   a plurality of electrical contacts received in the housing;
   at least one discrete securing member downwardly assembled to the housing around said cavity and moveably laterally engaged with the chip module to comply with movement of said chip module during installing the chip module into the cavity.

3. The assembly as claimed in claim 2, wherein at least one corner of the housing around the cavity is equipped with said securing member.

4. The assembly as claimed in claim 2, wherein the housing defines a peripheral wall surrounds said cavity, and a portion of an inner face of said peripheral wall is removed to leave a space receiving said securing member.

5. The assembly as claimed in claim 2, wherein said securing member defines a right angle configuration in a top view to comply with a corner of said housing.

6. The assembly as claimed in claim 2, wherein said securing member is capable of being detached from the housing.

7. The assembly as claimed in claim 2, wherein said securing member is moveable up and down and supported by a resilient device.

8. The assembly as claimed in claim 7, wherein said resilient device is unitarily formed with the housing.

9. The assembly as claimed in claim 8, wherein said resilient device is a cantilever arm.

10. The assembly as claimed in claim 2, wherein said securing member is insulative for preventing shorting.

11. The assembly as claimed in claim 2, wherein each of all four corners of the housing is equipped with one said securing member so as to respectively adjust a position of the chip module.

12. An electrical connector for electrically connecting an electronic package and a printed circuit board (PCB), comprising:
   an insulative housing defining a substantially rectangular cavity in a middle thereof, the cavity being adapted for receiving the electronic package therein;
   a plurality of electrical contacts received in the housing;
   at least one securing member engaged in the corners of the housing for supporting the chip module and able to slide in a upright direction;
   the securing member comprises a pair of supporting member vertical to each other and a pair of referring ribs defined on center position of the supporting members.

13. The electrical connector as claimed in claim 12, wherein the securing member further comprises an L-shaped hook on a free end thereof.

14. The electrical connector as claimed in claim 12, wherein the interfering rib comprises a leading portion on an upper position and a securing portion extending downwardly from the upper position.

15. The electrical connector as claimed in claim 12, wherein the housing further comprises a recess indented in corners between two adjacent sidewalls, the recess defines a pair of spring cantilevers vertical to each other from sidewalls adjacent to corners.

16. The electrical connector as claimed in claim 15, wherein the recess includes sidewalls and a channel formed on the sidewall of the recess, and the securing member defines an L-shaped hook on a free end thereof to slide in the channel.

17. The electrical connector as claimed in claim 12, wherein the housing defines at least one supporting pole on the corner thereof for engaging with the securing member.

* * * * *